(12) United States Patent
Gaillard et al.

(10) Patent No.: US 7,846,512 B2
(45) Date of Patent: Dec. 7, 2010

(54) METHOD FOR PRODUCING PATTERNS IN A POLYMER LAYER

(75) Inventors: Frédéric-Xavier Gaillard, Voiron (FR); Laurent Vandroux, Le Cheylas (FR)

(73) Assignee: Commissariat a l'Energie Atomique, Paris (FR)

( * ) Notice: Subject to any disclaimer, the term of this patent is extended or adjusted under 35 U.S.C. 154(b) by 336 days.

(21) Appl. No.: 12/149,367

(22) Filed: Apr. 30, 2008

(65) Prior Publication Data

US 2008/0274301 A1 Nov. 6, 2008

(30) Foreign Application Priority Data

May 4, 2007 (FR) .................................. 07 03230

(51) Int. Cl.
*H05H 1/24* (2006.01)
(52) U.S. Cl. ...................... 427/569; 427/577; 427/578; 427/579; 427/588
(58) Field of Classification Search ................ 427/569, 427/488, 577, 578, 579, 588
See application file for complete search history.

(56) References Cited

U.S. PATENT DOCUMENTS

| | | | | |
|---|---|---|---|---|
| 4,599,243 A | * | 7/1986 | Sachdev et al. ................ 216/18 |
| 5,470,693 A | * | 11/1995 | Sachdev et al. ............. 430/315 |
| 6,740,590 B1 | * | 5/2004 | Yano et al. ................... 438/692 |
| 2004/0029041 A1 | * | 2/2004 | Shih et al. ................. 430/271.1 |
| 2005/0051777 A1 | * | 3/2005 | Hill .............................. 257/72 |
| 2005/0216075 A1 | * | 9/2005 | Wang et al. ................. 623/1.15 |
| 2007/0134916 A1 | * | 6/2007 | Iwabuchi et al. ............ 438/636 |
| 2008/0227286 A1 | * | 9/2008 | Gaillard ....................... 438/619 |

FOREIGN PATENT DOCUMENTS

| | | |
|---|---|---|
| JP | A-64-002008 | 1/1989 |
| JP | A-01-059817 | 3/1989 |
| JP | B-2730893 | 12/1997 |

OTHER PUBLICATIONS

Karthaus, O., et al., "Formation of ordered mesoscopic patterns in polymer cast films by dewetting". Thin Solid Films 327-329 (1998) pp. 829-832.*
Richter, K., et al., "Variation of etch profile and surface properties during patterning of silicon substrates." Surface and Coatings Technology 142-144 (2001) pp. 797-802.*
Lee, Kyung-Bok, et al., "Patterning Si by Using Surface Functionalization and Microcontact Printing with a Polymeric Ink". Korean J. Chem. Eng. 20(5), pp. 956-959 (2003).*
French Patent Application No. FR 07 02218, filed Mar. 27, 2007.

* cited by examiner

*Primary Examiner*—Bret Chen
(74) *Attorney, Agent, or Firm*—Oliff & Berridge, PLC

(57) ABSTRACT

A method for producing patterns in a polymer layer. Polymer sites are formed on a support. These sites are subjected to a plasma deposition of dielectric material and preferably react with this plasma so as to form openings at the level of said sites. A pattern structure is then formed in the dielectric material and/or in the polymer.

10 Claims, 2 Drawing Sheets

METHOD FOR PRODUCING PATTERNS IN A POLYMER LAYER

BACKGROUND OF THE INVENTION

The invention relates to a method for producing pattern structures by means of a polymer deposited on a support.

STATE OF THE ART

At the present time, producing patterns on a micro/nanometric scale is difficult to achieve using conventional lithographic methods, with exposure of a resin.

The use of Deep UltraViolet radiation (DUV) having reached its limits, this technique has been replaced by Extreme UltraViolet (EUV) radiation. Reducing the wavelength of the radiation used has enabled finer patterns to be obtained. This radiation (193 nm wavelength) coupled with resolution enhancement techniques, for example optical proximity correction (OPC) or phase-shift masks (PSM), enables patterns of size smaller than the wavelength to be produced. As this approach has also reached its limits, improvements have been made to the scanners. The latter have seen their refraction index increased by addition of a liquid between the resin and the lens through which the UV radiation passes.

These developments have resulted in a sharp increase of the price of lithography equipment and masks. However, these conventional lithographic methods are no longer able to meet the specifications of the next generations of integrated circuits. In addition, with the expected increase of the cost of the next generations of conventional lithographic equipment, new techniques are envisaged.

The e-beam is a field in which renewed interest is currently being shown. The e-beam technique consists in exposing the resin by means of an electron beam without using a prior mask. This method has been used for a large number of years for producing lithography masks. This technique does however present numerous shortcomings, it does not enable large production volumes to be achieved and it is subject to charge effects. It is also important to point out that to meet with the specifications of the forthcoming integrated circuit generations, new resins with improved performance will have to be developed.

The use of diblock copolymers is also a way of improving studied in particular in French Patent application 0702218 filed on 27 Mar. 2007. The major drawback of this technique is that it uses two non-miscible polymers whose spatial distribution is difficult to control. Under these conditions, the use of diblock copolymers imposes working under a limit thickness to obtain a large uniformity in the size of the pores and/or using a hard mask layer.

Once the pattern structure has been defined by any suitable known technique, the resin acts as etching mask to reproduce the mask design at least in the layer immediately underneath. This etching is conventionally performed using a plasma. Depending on the layers in presence, the characteristics of the plasma are defined to etch the support layer on which the resin mask is placed.

OBJECT OF THE INVENTION

The object of the invention consists in palliating the above-mentioned shortcomings and in particular in producing patterns by means of a polymer by a method that is easy to implement and less expensive to industrialize than conventional technologies. This method further has to preferably be compatible with the dimensional specifications of the future generations of integrated circuits.

BRIEF DESCRIPTION OF THE DRAWINGS

Other advantages and features will become more clearly apparent from the following description of particular embodiments of the invention given as non-restrictive examples only and represented in the accompanying drawings, in which.

DESCRIPTION OF PARTICULAR EMBODIMENTS

Figure 1:
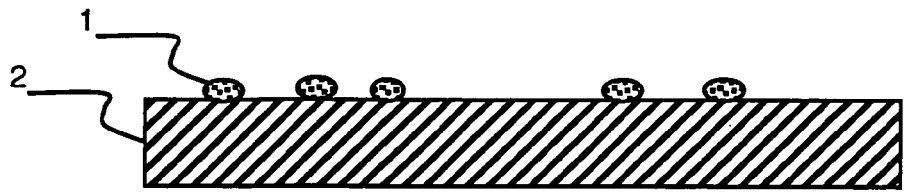
FIGS. 1 and 2 represent the successive steps of an embodiment of a method according to the invention.

As illustrated in FIG. 1, according to a particular embodiment, polymer aggregates 1 are produced on a support 2. Support 2 is preferably of semi-conducting type and advantageously a silicon substrate. Support 2 can also comprise a stack of layers achieved prior to deposition of polymer aggregates 1. Polymer aggregates 1, i.e. a set of molecules or particles, are obtained for example by deposition of a drop of polymer material after a solvent has been evaporated. The deposited polymer is for example a carbonaceous-based resin, or more generally any resin able to be eliminated by means of an oxidizing or reducing plasma. Polymer aggregates 1 are deposited with a predefined organization by any known means. Deposition of polymer drops is advantageously performed by means of Altadrop® or Xennia® equipment. The drops have for example a diameter larger than or equal to 10 nm and advantageously a diameter larger than or equal to 25 nm. Polymer deposition can moreover be achieved by chemical vapor deposition and advantageously by plasma enhanced chemical vapor deposition thereby depositing for example amorphous carbon.

Figure 2:
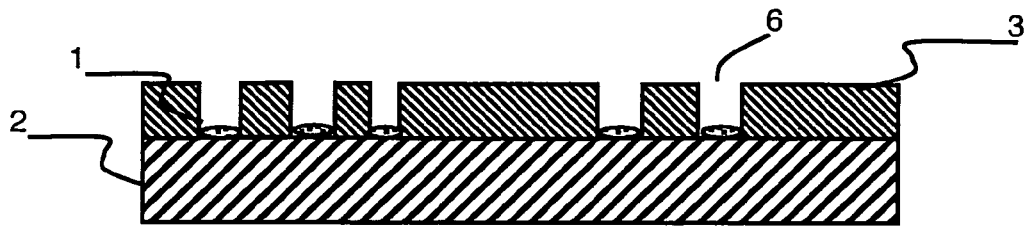

Then, as illustrated in FIG. 2, substrate 2 and deposited polymer aggregates 1 are subjected to a plasma. The plasma can be of oxidizing type or reducing type and presents characteristics used in known manner to perform deposition of a dielectric material 3. The choice of type of plasma is made according to the material that is to be deposited and/or the nature of the previously deposited polymer. For example, an oxidizing plasma enabling deposition of silicon oxide can be used. This plasma can then comprise a silicon precursor and oxygen, for example a mixture of oxygen and TetraEthylOxySilane ($Si(OC_2H_5)_4$). The plasma advantageously presents the following characteristics: a pressure comprised between 5 and 15 torr, a power between 300 and 1000 W, a temperature between 300 and 450° C., an oxygen ($O_2$) flowrate between 0.5 and 2 Slm, a helium (He) flowrate between 0.5 and 2 Slm, and a TEOS flowrate between 100 mg/min and 2 g/min. For example, the plasma can present the following characteristics: pressure 7.5 torr, power 380 W, temperature 400° C., $O_2$ flowrate 2.15 Slm, He flowrate 1 Slm, TEOS flowrate 250 mg/min. A flowrate of 1 Slm (1 standard liter/minute) corresponds to a flowrate equivalent to 1 liter per minute under standard pressure and temperature conditions. These plasma characteristics are those used in known manner to perform TEOS deposition and can be modified if required. In the case of use of a reducing plasma, the deposited materials are for example of SiN, SiC, SiCN type for which the agent enabling the polymer to be etched is hydrogen. The skilled artisan will adapt the conditions of the plasma method for example in terms of pressure, power, temperature, and gas flowrates so as to obtain simultaneity of etching and deposition. Adjusting the plasma conditions (for example radiofrequency power, gas flows, working pressure, temperature . . . ) can in fact enable a method to be obtained that is suitable for each type of polymer and better suited to performing the required application.

The plasma characteristics and the choice of polymer are defined in such a way that the polymer presents preferential reaction sites with the plasma and that deposition of dielectric material 3 by the plasma takes place only in the zones of substrate 2 that are not protected by aggregates 1. As far as polymer aggregates 1 are concerned, their surface in a general manner presents a certain density of preferential reaction sites and/or of sites having a volume of action such that all or at least part of the surface of aggregate 1 can be assimilated as being reactive. The reaction may in fact not take place on the whole surface of aggregate 1. The reaction which takes place between the polymer and the plasma then prevents any deposition.

A polymer aggregate 1 therefore generally reacts with the plasma at the level of preferential reaction sites of the polymer and thereby prevents any deposition of dielectric material at this level. The preferential reaction sites present at the surface of the polymer are for example zones presenting a different roughness from the rest of the polymer surface.

Depending on the nature of the polymer, the characteristics of the plasma and the plasma application time, two configurations can arise. A plasma application time that does not eliminate the aggregates 1 and/or plasma conditions that do not foster refilling of the air gaps are preferably chosen.

In a first configuration illustrated in FIG. 2, the polymer is at least partially eliminated by the plasma and aggregates 1 can then disappear from the bottom of openings 6. However, as in FIG. 3, the latter are not closed before deposition of a certain thickness of dielectric material, non-conformal deposition preferably being chosen.

Figure 3:
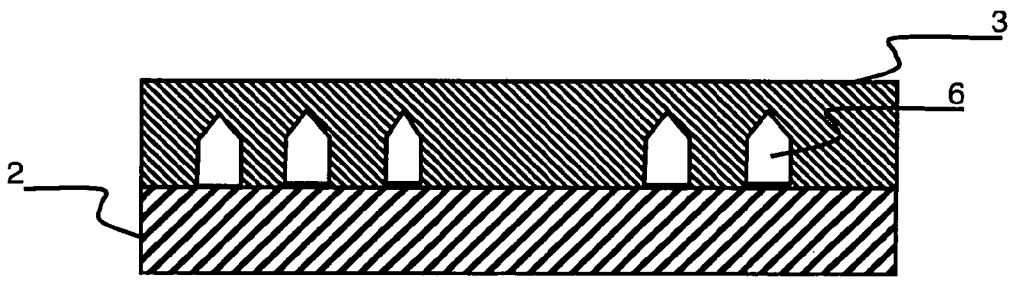
FIG. 3 represents an alternative embodiment of the step of FIG. 2.

Depending on the thickness of dielectric material 3 deposited and on the plasma conditions, polymer aggregates 1 are partially or totally consumed. In the case where the polymer has not been completely consumed, it can be subsequently eliminated in known manner by selective removal with respect to the dielectric material deposited. In a second configuration, if, as illustrated in FIG. 3, the deposition is thick enough, the patterns defined by polymer aggregates 1 are hidden by the excess thickness which refills the top of openings 6. Dry or wet etching of the excess thickness can enable the openings to be made visible if required.

This then results in formation of an etching mask within dielectric material layer 3.

Advantageously, in the embodiment illustrated in FIGS. 1 to 3, pores, i.e. the openings, are precisely localized by means of the prior localization of the polymer aggregates. In this case, whole of the exposed surface of the polymer reacts with the plasma.

Figure 4:
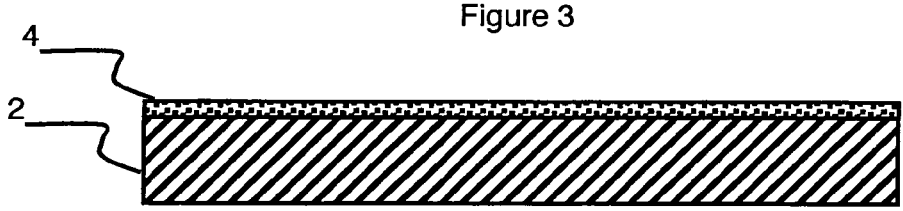
FIGS. 4 to 7 represent the successive steps of a second embodiment of a method according to the invention.

According to another embodiment, as illustrated in FIG. 4, a polymer layer 4 is deposited full-wafer on the substrate 2. This layer 4 is preferably thin, with a thickness typically ranging from 10 to 500 nm and advantageously between 25 and 75 nm, for example 50 nm to obtain process times compatible with an industrial application. This polymer layer 4 is for example made of amorphous carbon deposited by any known method, for example by plasma enhanced chemical vapor deposition.

Figure 5:
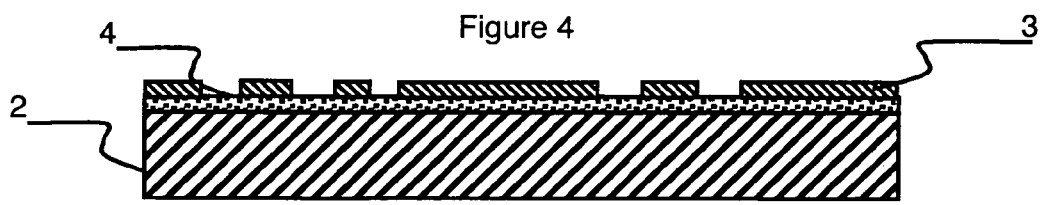
Figure 6:
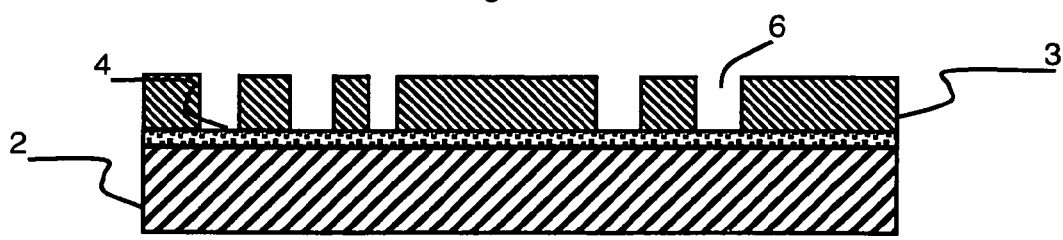

As illustrated in FIGS. 5 and 6, polymer layer 4 is then subjected to a plasma. The plasma is for example an oxidizing plasma performing TEOS deposition (for example: 7.5 torr, 380 W, 400° C., $O_2$ 2.15 Slm, He 1 Slm, TEOS 250 mg/min). The nature of layer 4, its deposition conditions and the plasma conditions are defined such that the polymer comprises on its surface preferential reaction sites to the plasma and sites where the reactivity to the plasma is zero or negligible compared with the preferential reaction sites. The density of preferential reaction sites depends on the nature of the polymer, its deposition method and the characteristics of the plasma.

Figure 7:
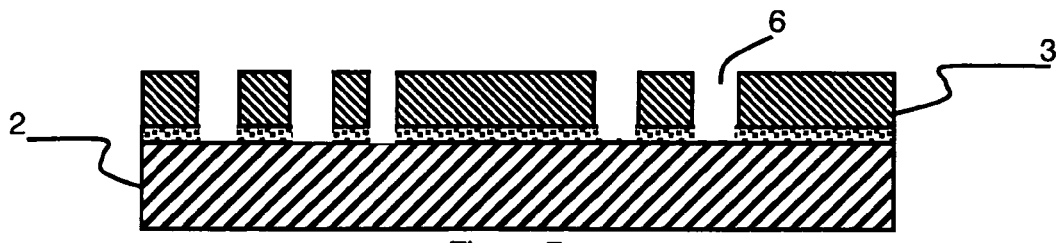

Depending on the plasma conditions, the latter reacts preventing deposition of dielectric material 3 on the preferential reaction sites, as illustrated in FIGS. 5 and 6. This results, during plasma deposition, in deposition only on the polymer in the zones not containing preferential reaction sites. As previously, openings 6 corresponding to the zones characterized by an absence of deposition thus form a pattern structure in the dielectric material 3. The lack of deposition above the preferential reaction sites can be concomitant with a consumption of the polymer of layer 4 in the preferential reaction sites (FIG. 7). In this case, the pattern structure is formed both in dielectric material layer 3 and in polymer layer 4. Depending on the plasma conditions and the nature of the polymer deposited, the preferential reaction sites within the polymer layer can be assimilated for example to variations of the roughness or of the nature of the material, i.e. to local variations of its stoichiometry.

Figure 8:
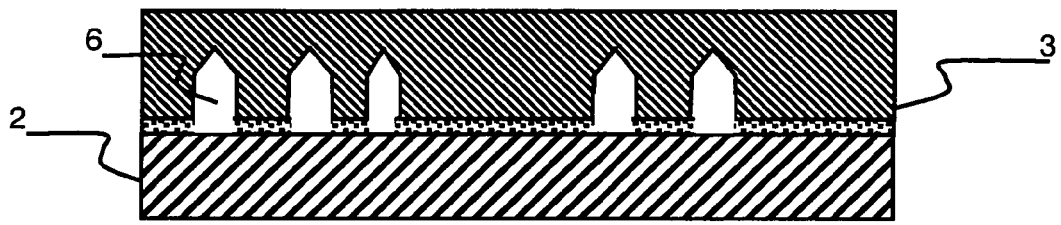
FIG. 8 represents an alternative embodiment of the step of FIG. 7.

As mentioned above and illustrated in FIG. 8, the thickness of dielectric material deposited may be sufficient to close openings 6 at the top end thereof (whether the polymer is completely consumed or not). The pattern structure can then be re-uncovered by performing for example chemical mechanical polishing or by physical or wet etching of the top part of deposited dielectric material layer 3.

Under certain conditions, polymer layer 4 having been completely eliminated, a thin dielectric material deposit may then appear in the bottom of the gap. Once layer 4 has been eliminated, deposition of dielectric in the gap is in fact then possible. Particular attention should therefore be paid to the dielectric deposition conditions so that this material is so-called "non-conformal", i.e. it sustains the maskwork existing within dielectric layer 3. Air gaps are therefore formed in dielectric layer 3, the gap being able to be bounded by dielectric only.

In the above cases, dielectric layer 3 is used as a mask, i.e. dielectric layer 3 comprises the essential part of the pattern maskwork.

Figure 9:
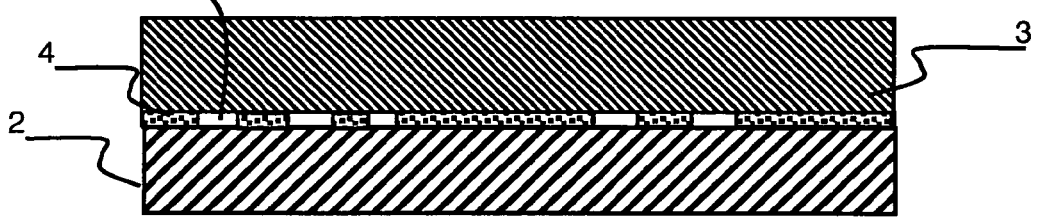
FIG. 9 represents a third embodiment.

According to another embodiment illustrated by FIG. 9, the polymer constituting layer 4, the nature and deposition conditions of layer 3 on layer 4 and the plasma conditions are defined such that at its surface the polymer comprises preferential reaction sites to plasma such that the plasma reacts with these sites eliminating the polymer. Advantageously, polymer material layer 4 is chosen with a larger thickness than in the other embodiments. This then results in polymer layer 4 being eliminated in the preferential reaction sites, during deposition by plasma. In this way, in this embodiment, the pattern structure is then essentially or even solely formed in polymer layer 4. Openings 7 formed in layer 4 are then covered by dielectric material 3, as is the rest of layer 4. Whereas in the previous cases dielectric layer 3 essentially contains the maskwork linked to the reaction between the plasma and polymer 4, in this case the maskwork is essentially situated within polymer layer 4.

Figure 10:
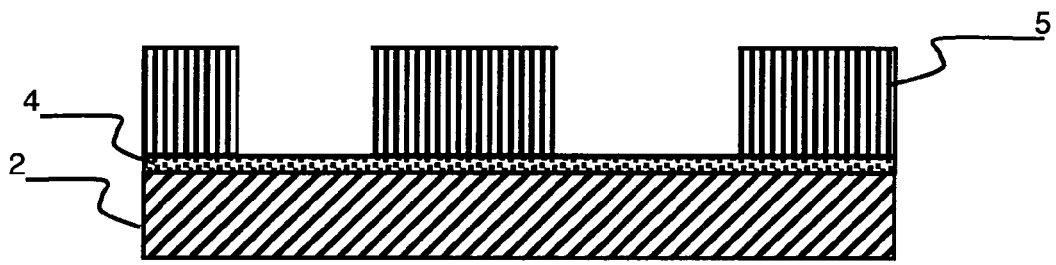
FIGS. 10 and 11 represent the successive steps of a fourth embodiment of a method according to the invention.
Figure 11:
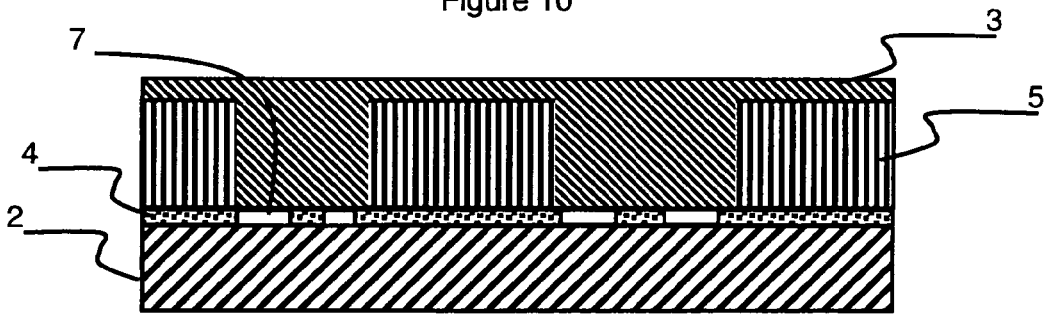

A fourth embodiment, illustrated in FIG. 10, represents a variant of the embodiment of FIG. 9 where an additional step is added between deposition of polymer layer 4 and deposition by plasma. In this additional step, an additional layer 5 is deposited and etched with a predefined pattern, and masks zones in which the reaction of polymer layer 4 with the plasma is not sought for. The pattern structure can therefore be formed only in the zones of layer 4 that are not covered by additional layer 5. This additional step can also be introduced into the embodiments of FIGS. 1 to 8.

The pattern structure achieved at least in dielectric material layer 3 can be used as etching mask to define a new pattern structure in support 2 or any layer situated under dielectric material layer 3. Transfer of the pattern structure through the dielectric material can be performed in known manner by wet etching or by means of plasma etching. Likewise, an additional layer acting as hard mask can be used to facilitate the etching steps.

This production method can be used for example for producing interconnection structures with air gaps or for producing porous membranes for biotechnologies. Openings 6, 7 can for example constitute channels when polymer drops 1 are aligned (FIGS. 1 to 3) or when the zones containing the preferential reaction sites have the corresponding shape.

Forming a porous membrane is particularly advantageous according to the embodiment illustrated in FIGS. 4 to 6. Solely preferential sites are in fact exposed and a uniform disposition of pores is advantageously obtained, particularly pores whose diameter is less than 50 nm.

The invention claimed is:

1. A method for producing a pattern structure comprising:
   providing a support comprising polymer sites that react under a plasma deposition atmosphere by preventing plasma deposition on the polymer sites; and
   depositing a dielectric material on the support comprising the polymer sites under the plasma deposition atmosphere, wherein the dielectric material deposits on the support and the polymer sites are devoid of the dielectric material.

2. The method according to claim 1, further comprising forming said polymer sites on the support by full-wafer deposition of a polymer, the polymer presenting preferential reaction sites and zones that are not reactive to a plasma.

3. The method according to claim 2, wherein at least one opening is formed in the polymer.

4. The method according to claim 2, wherein the plasma is an oxidizing plasma, a reducing plasma, or a plasma under oxidizing or reducing atmosphere.

5. The method according to claim 2, wherein the polymer is amorphous carbon.

6. The method according to claim 2, wherein the plasma is an oxidizing plasma and the dielectric material deposited is silicon oxide.

7. The method according to claim 2, wherein the plasma is a reducing plasma and the dielectric material deposited is SiCN or SiC or SiN.

8. The method according to claim 1, wherein said polymer sites are formed by depositing polymer aggregates on the support, the arrangement of said aggregates corresponding to the pattern structure.

9. The method according to claim 1, wherein at least one opening is formed in the dielectric material facing the polymer sites.

10. The method according to claim 1, wherein the polymer sites are formed by zones of different roughness on a surface of a polymer and/or zones of variations in the stoichiometry.

* * * * *